United States Patent [19]

Hirata

[11] Patent Number: 4,896,331

[45] Date of Patent: Jan. 23, 1990

[54] DISTRIBUTED FEEDBACK SEMICONDUCTOR LASER

[75] Inventor: Shoji Hirata, Kanagawa, Japan

[73] Assignee: Sony Corporation, Tokyo, Japan

[21] Appl. No.: 171,768

[22] Filed: Mar. 22, 1988

[30] Foreign Application Priority Data

Mar. 30, 1987 [JP] Japan .................................. 62-78763

[51] Int. Cl.⁴ ................................................ H01S 3/08
[52] U.S. Cl. ........................................ 372/96; 372/102
[58] Field of Search ............................ 372/96, 102, 46

[56] References Cited

U.S. PATENT DOCUMENTS

| | | | |
|---|---|---|---|
| 4,665,528 | 5/1987 | Chinone et al. | 372/96 |
| 4,701,930 | 10/1987 | Akiba et al. | 372/96 |
| 4,726,031 | 12/1988 | Wakao et al. | 372/96 |
| 4,740,987 | 4/1988 | McCall et al. | 372/96 |
| 4,751,710 | 6/1988 | Yamaguchi et al. | 372/96 |
| 4,775,980 | 10/1988 | Chinone et al. | 372/96 |
| 4,796,274 | 1/1989 | Akiba et al. | 372/96 |

FOREIGN PATENT DOCUMENTS

| | | | |
|---|---|---|---|
| 0046712 | 12/1978 | Japan | 372/96 |
| 0080984 | 5/1984 | Japan | 372/96 |
| 0220493 | 9/1986 | Japan | 372/96 |

Primary Examiner—Frank Gonzalez
Attorney, Agent, or Firm—Hill, Van Santen, Steadman & Simpson

[57] ABSTRACT

A distributed feedback semiconductor laser has a first cladding layer, an active layer, a guide layer on which a diffraction grating is formed and a second cladding layer, the effective thickness of the guide layer in the waveguide direction being made different in one region to change the phase of a light propagating through the waveguide.

6 Claims, 6 Drawing Sheets

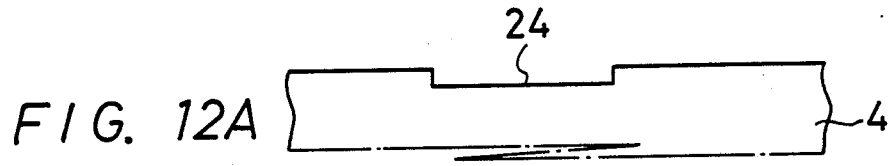
FIG. 12A
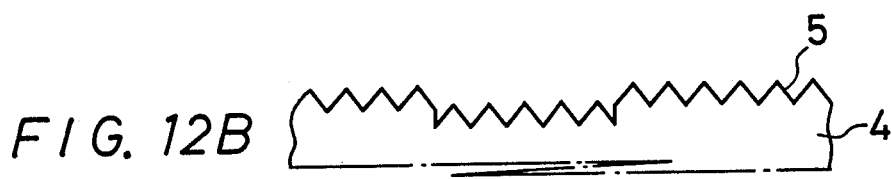
FIG. 12B
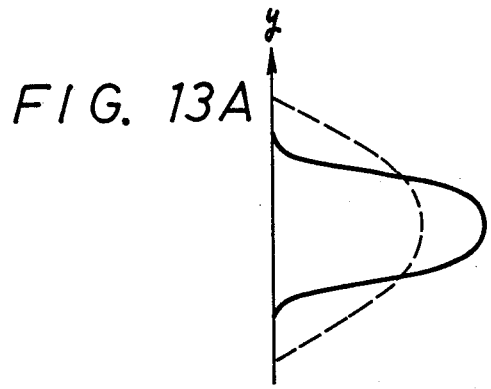
FIG. 13A
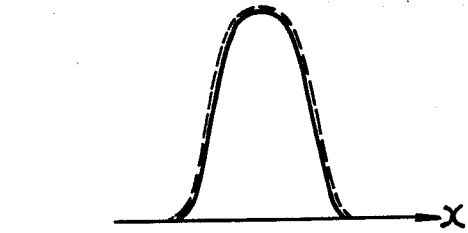
FIG. 13B
FIG. 14
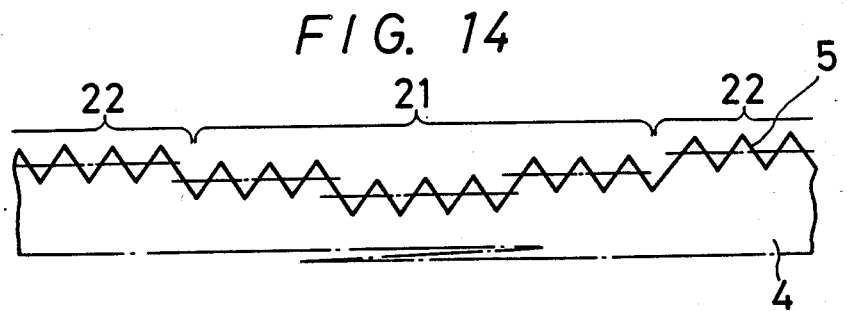

DISTRIBUTED FEEDBACK SEMICONDUCTOR LASER

BACKGROUND OF THE INVENTION

1. Field of the Invention

The present invention relates generally to distributed feedback semiconductor lasers and, more particularly, to a distributed feedback semiconductor laser with a $\lambda/4$ (quarter wavelength) phase-shifting structure.

2. Description of the Prior Art

A distributed feedback (hereinafter simply referred to as DFB) laser is one of the light sources used in long-haul and high-bit-rate transmission systems such as fiber optic communication, because it is easy to provide single longitudinal mode oscillation.

FIG. 1 is an enlarged perspective view schematically illustrating a known distributed feedback semiconductor laser. As shown in FIG. 1, this DFB laser comprises one conductivity type, for example, p-type GaAs semiconductor substrate 1 on which are sequentially grown an AlGaAs cladding layer 2, a GaAs active layer 3 and another conductivity type, for example, n-type AlGaAs guide layer 4. A diffraction grating 5 is formed on the guide layer 4. On the guide layer 4, there are sequentially grown the same conductivity type, for example, n-type AlGaAs cladding layer 6 and an n-type GaAs capping layer 7. The capping layer 7 undergoes the ion implantation using an ion such as a proton and a boron to form current restriction regions 8 of high resistivity at both sides of the stripe-shaped central portion of the capping layer 7. A pair of opposing electrodes 9 and 10 are respectively formed on the upper surface of the capping layer 7 and the rear surface of the semiconductor substrate 1 in ohmic contact therewith.

In the conventional DFB semiconductor laser having the uniform diffraction grating, there are two longitudinal modes with equal threshold gain in principle on both sides of the Bragg wavelength. There is then a possibility that this DFB semiconductor laser will operate in double lasing modes. In practice, it is frequent that the known DFB semiconductor laser operates in double lasing modes, causing so-called mode-hopping noise. To overcome this defect and to effect the oscillation in a single longitudinal mode, a DFB semiconductor laser with a $\lambda/4$ phase-shifting structure has been proposed. Also, various methods for realizing this improved DFB semiconductor laser have been proposed experimentally.

For example, as shown in FIG. 2, the phase-shifted DFB laser is realized by directly phase-shifting the diffraction grating 5 at its central portion of the waveguide by a distance of $\lambda/4$.

FIGS. 3A and 3B illustrate examples of further conventional phase-shifted DFB semiconductor lasers. According to the lasers shown in FIGS. 3A and 3B, the diffraction grating 5 is formed uniformly and the width of the stripe-shaped optical waveguide is changed at its central portion (w1≠w2).

FIG. 4 further illustrates another example of the conventional phase-shifted DFB semiconductor laser. In this DFB semiconductor laser, as shown in FIG. 4, the central diffraction grating portion of the diffraction grating 5 is removed to form a smooth or flat region 11 and this flat region 11 is used to carry out the effective phase shift.

The above methods for effecting the $\lambda/4$ phase shift have the following problems. In the method described in connection with FIG. 2, the process for forming the diffraction grating 5 becomes complicated and it is difficult to form the diffraction grating 5. In addition, there is a problem that there are respectively formed an area in which the diffraction grating is not formed, and an area in which the diffraction grating is disturbed. In this case, if the $\lambda/4$ phase-shifting diffraction grating is formed, there occurs no problem.

According to the methods shown in FIGS. 3A and 3B, with respect to the transverse modes a and b in the x and y (horizontal and vertical direction as shown in FIG. 1), the mode distribution in the x direction is changed as shown in FIG. 5B (a solid line represents the mode distribution of a diffraction grating region 13 having the width w1 and a dashed line represents the mode distribution of the phaseshifting region 12 having the width w2). Then, the resultant effective refractive index difference $\Delta N$ between the diffraction grating region 13 and the phase-shifting region 12 is used to carry out the effective phase shift. Essentially, these methods shown in FIGS. 3A and 3B are techniques that are only applicable to the refractive index guide type DFB semiconductor laser. The mode distribution in the y direction is not changed substantially as shown in FIG. 5A.

According to the method shown in FIG. 4, the mode distribution in the y direction is changed as shown in FIG. 6A (a solid line represents the mode distribution of the diffraction grating region 13 and a dashed line represents the mode distribution of the phase-shifting region 12) and the resultant effective refractive index difference $\Delta N$ is used to carry out the effective phase-shift. However, because of the flat phase-shifting region 12 in which the diffraction grating is not formed, the coupling is weakened. If this method is applied to a refractive index guiding type semiconductor laser structure (buried laser, channeled substrate planar laser, ridge-waveguide laser and rib-waveguide-stripe laser, etc.), the mode distribution in the x direction is therefore changed as shown in FIG. 6B. Thus, the transverse mode is considerably changed at the boundary portion of the phase-shifting region 12 so that reflection loss occurs, etc. Particularly when this method is applied to the rib-waveguide-stripe DFB laser shown in FIG. 7, it becomes difficult to provide a difference in the thickness between the phase-shifting region 12 and flat portions 14 at the both sides of the phase-shifting region 12. As a result, the waveguide mechanism is changed in the phase-shifting region 12 from the refractive index guiding type to the gain guiding type, thus producing optical scattering loss.

Further, according to this method, if the pitch of the diffraction grating 5 is determined, the difference h in the effective thickness of the guide layer between the diffraction grating region 13 and the phase-shifting region 12 is inevitably determined so that the effective refractive index difference N is also determined. Thus, since $\Delta N \times l = \lambda/4$, the length l of the phase-shifting region 12 cannot be selected freely.

OBJECTS AND SUMMARY OF THE INVENTION

Accordingly, it is an object of the present invention to provide an improved distributed feedback semiconductor laser with a $\lambda/4$ phase-shifted structure.

It is another object of the present invention to provide a distributed feedback semiconductor laser which can positively operate in the single longitudinal mode oscillation.

It is a further object of the present invention to provide a distributed feedback semiconductor laser in which the length of the phase-shifting region can be freely selected and can be optimized.

It is a further object of the present invention to provide a distributed feedback semiconductor laser which can prevent the coupling from being deteriorated.

It is still a further object of the present invention to provide a distributed feedback semiconductor laser whose diffraction grating can be formed with ease.

It is yet a further object of the present invention to provide a distributed feedback semiconductor laser which can be applied to both index guiding and gain guiding distributed feedback semiconductor lasers.

According to an aspect of the present invention, there is provided a distributed feedback semiconductor laser comprising:
 (a) a first cladding layer formed on a substrate;
 (b) an active layer formed thereon;
 (c) a guide layer having formed thereon a diffraction grating; and
 (d) a second cladding layer, wherein a stripe-shaped waveguide is formed therein and the thickness of said guide layer with said diffraction grating in the waveguide direction is made different to change the phase of a light propogating through the waveguide.

These and other objects, features and advantages of the present invention will become apparent from the following detailed description of the preferred embodiments to be taken in conjunction with the accompanying drawings, throughout which like reference numerals identify the same or similar parts.

BRIEF DESCRIPTION OF THE DRAWINGS

FIGS. 12A and 12B are respectively process diagrams showing an example of a method for manufacturing a diffraction grating according to the present invention;

FIGS. 13A and 13B are respectively graphical representations of transverse mode distributions of y direction and x direction of the semiconductor laser shown in FIG. 8; and FIG. 14 is an enlarged cross-sectional view of a main portion of another embodiment of the diffraction grating according to the present invention.

DETAILED DESCRIPTION OF THE PREFERRED EMBODIMENTS

An embodiment of a distributed feedback semiconductor laser according to the present invention will now be described with reference to FIGS. 8 to 10.

Figure 1:
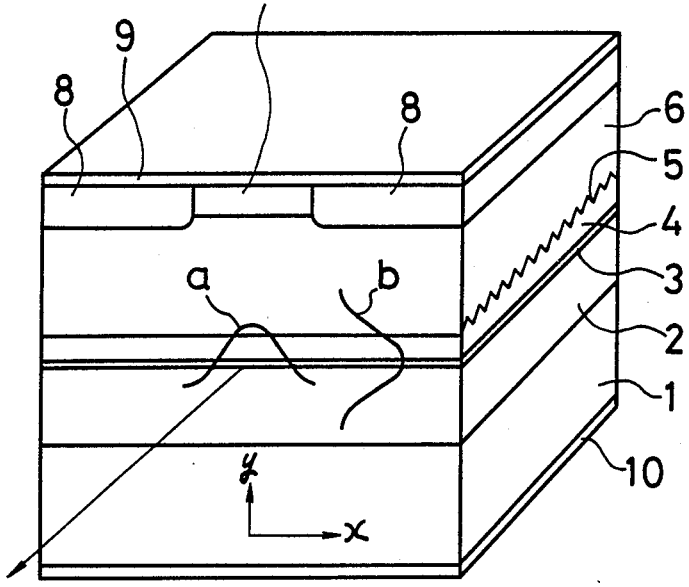
FIG. 1 is an enlarged perspective view schematically illustrating an example of a known distributed feedback semiconductor laser.
Figure 2:
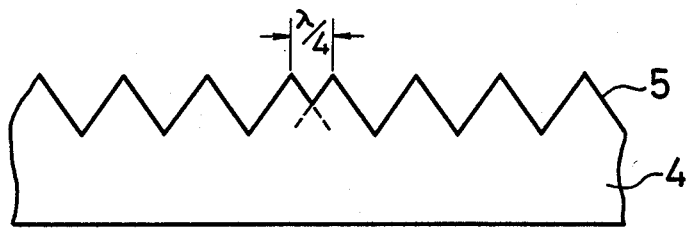
FIG. 2, FIGS. 3A, 3B and FIG. 4 are respectively schematic representations showing examples of conventional diffraction grating structures used to carry out the λ/4 phase shift.
Figure 3A:
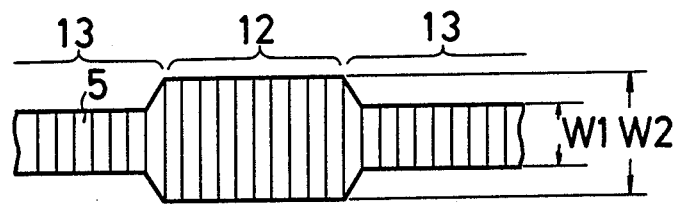
Figure 3B:
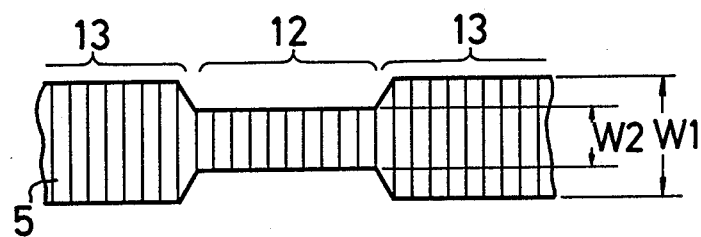
Figure 4:
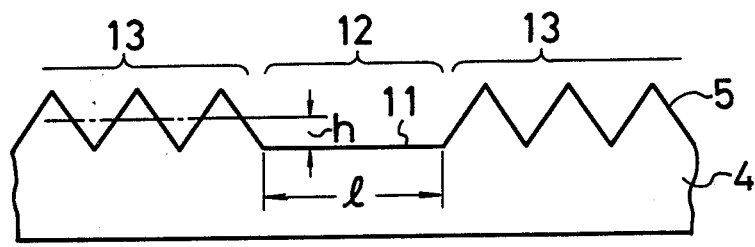
Figure 5A:
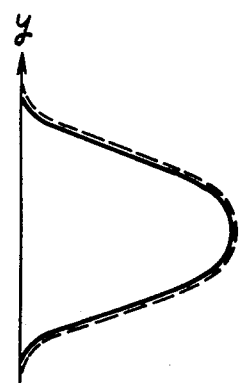
FIGS. 5A and 5B are respectively graphical representations used to explain the transverse mode distributions of the y direction and the x direction in the cases of FIGS. 3A and 3B.
Figure 5B:
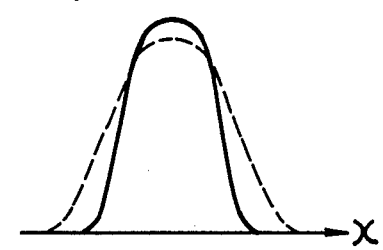
Figure 6A:
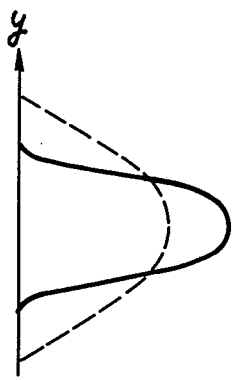
FIGS. 6A and 6B are respectively graphical representations used to explain the transverse mode distributions of the y direction and the x direction in the case of FIG. 4.
Figure 6B:
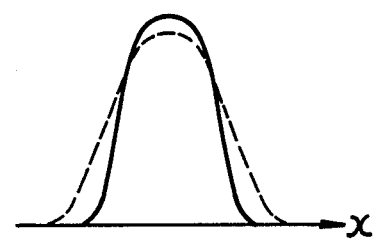
Figure 7:
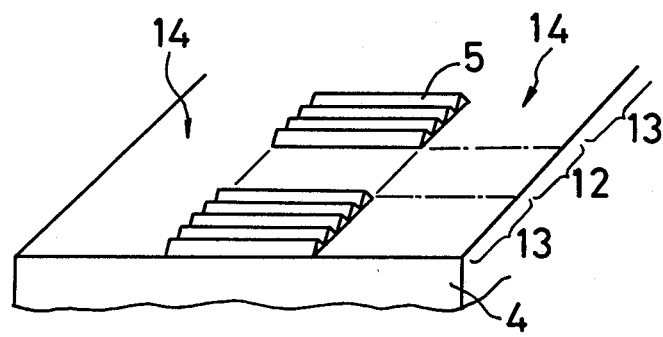
FIG. 7 is a perspective view illustrating the diffraction grating used in a rib-waveguide-stripe laser.
Figure 8:
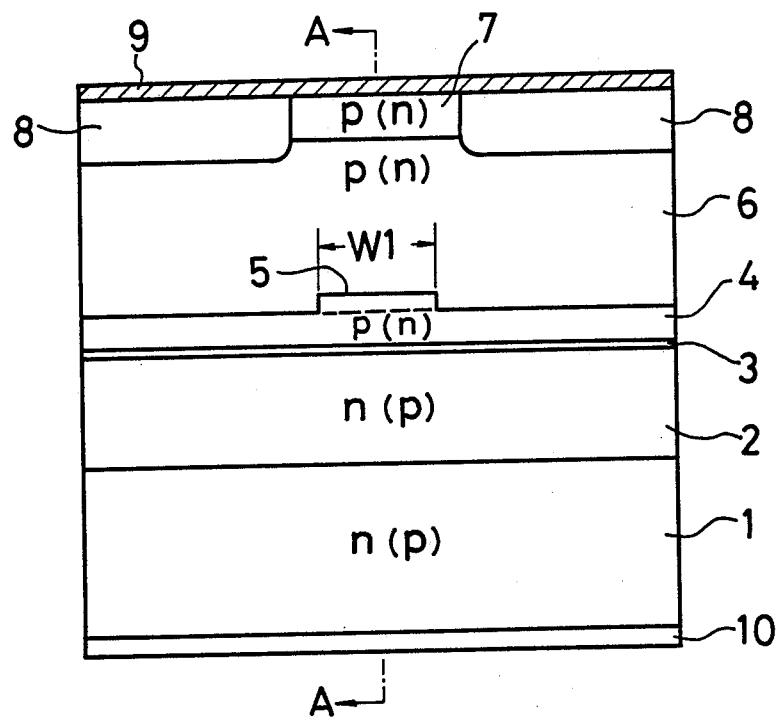
FIG. 8 is an enlarged cross-sectional view schematically illustrating an embodiment of a distributed feedback semiconductor laser according to the present invention.
Figure 9:
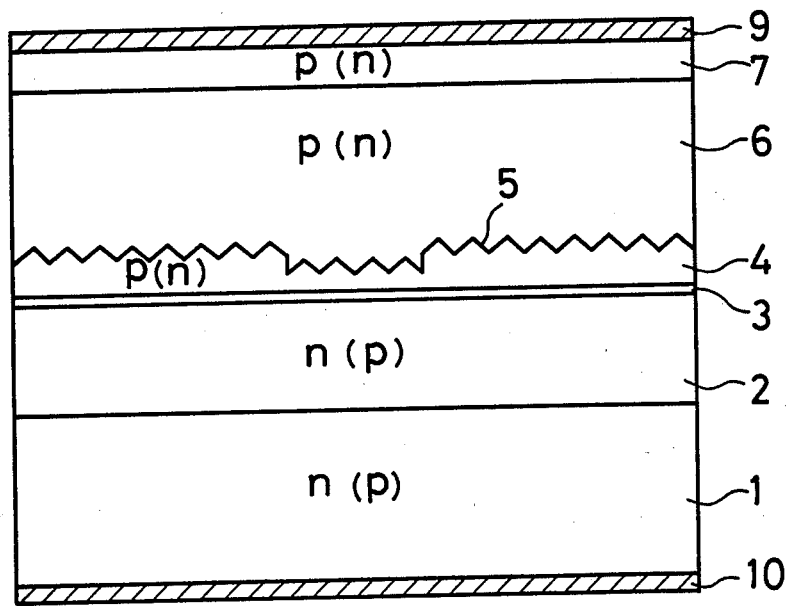
FIG. 9 is a cross-sectional view taken through line A—A in FIG. 8.
Figure 10:
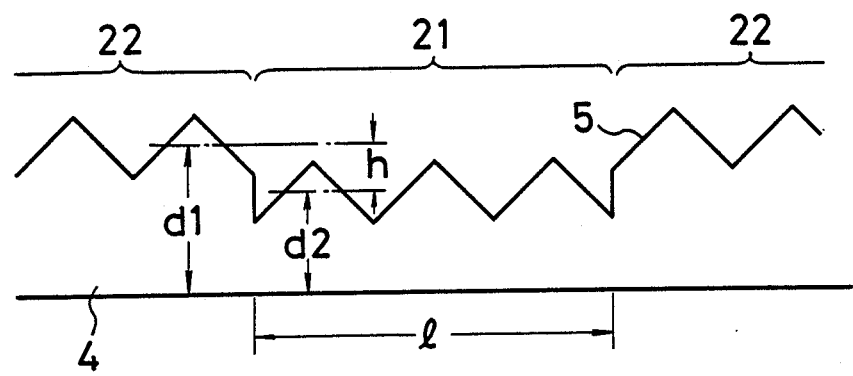
FIG. 10 is an enlarged cross-sectional view illustrating a main portion of an example of a diffraction grating used in the present invention.

FIG. 8 is an enlarged cross-sectional view schematically showing an embodiment of a rib-waveguide DFB laser according to the present invention, FIG. 9 is an enlarged crosssectional view taken through line A—A in FIG. 8, and FIG. 10 is an enlarged cross-sectional view illustrating a main portion of the diffraction grating thereof. In FIGS. 8 and 9, like parts corresponding to those of FIG. 1 are marked with the same references.

In accordance with this embodiment, there is prepared one conductivity type, for example, n-type GaAs substrate 1. On one major surface thereof, there are epitaxially grown the same conductivity type, that is, n-type AlGaAs cladding layer 2, the intrinsic GaAs active layer 3 and another conductivity type, for example, the p-type AlGaAs guide layer 4 in this order. On the surface of the guide layer 4, there is fOrmed the diffraction grating 5 having a width w1 and the uniform pitch. As shown in FIG. 10, this diffraction grating 5 is formed such that it has a region (hereinafter simply referred to as a phase-shifting region) 21 at substantially the central region thereof in the waveguide direction, having a length l. There is provided a difference h in the effective thickness of the guide layer 4 between the phase-shifting region 21 and other diffraction grating regions 22 over the length l, in other words, this diffraction grating 5 is formed such that the effective thickness d2 of the guide layer 4 for the phase-shifting region 21 becomes smaller than the effective thickness d1 of the guide layer 4 for other diffraction grating regions 22 (d2<d1). That is, the diffraction grating 5 having the uniform pitch exists also in the phase-shifting regions 21, as well as in the other regions 22.

Figure 11:
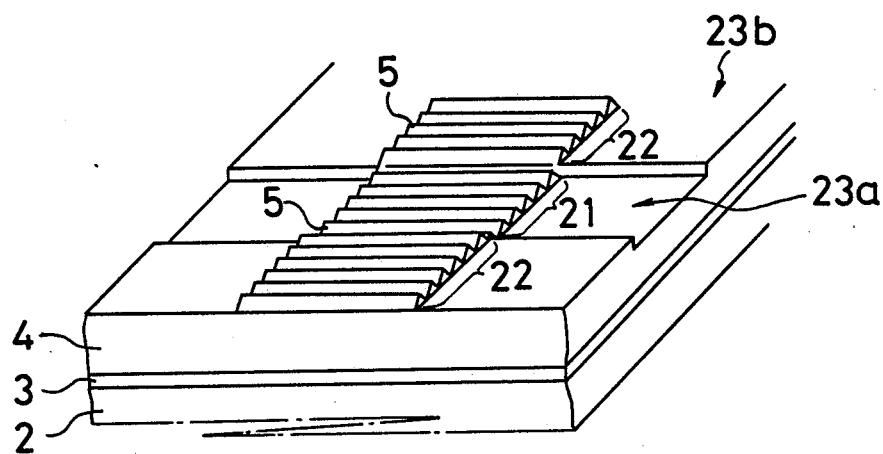
FIG. 11 is a perspective view of a main portion of the diffraction grating shown in FIG. 10.

Further, as shown in FIG. 11, the surfaces of the guide layer 4 at both sides of the diffraction grating 5 are formed flat and a flat portion 23a, corresponding to the phase-shifting region 21, and flat portions 23b, corresponding to other diffraction grating regions 22, are formed to have a step therebetween. On the whole surface of the guide layer 4 having such diffraction grating 5 and the flat surfaces at both sides of the diffraction grating 5, there is epitaxially grown, for example, a layer with the same conductivity type as that of the guide layer 4, for example, a p-type AlGaAs cladding layer 6 having a band gap larger than those of the guide layer 4 and the active layer 3. On the cladding layer 6, there is epitaxially grown a layer with the same conductivity type as that of the cladding layer 6, for example, an n-type GaAs capping layer 7.

Then, from the surface of the capping layer 7, an ion such as proton, boron or the like is selectively implanted to portions of the capping layer 7, except those opposing the central striped portion of the guide layer 4 on which the diffraction grating 5 is formed, to selectively form current restriction regions 8 of high resistivity. Also in this case, the opposing electrodes 9 and 10 are respectively formed on the capping layer 7 and on the rear surface of the substrate 10 in ohmic contact therewith.

A method of manufacturing the diffraction grating 5 will now be described. As shown in FIG. 12A, a portion 24 of the guide layer 4 corresponding to its phase-shifting region 21 is etched in advance to form a step portion or a concave portion. Under this state, the diffraction grating 5 is then uniformly formed on the whole necessary surface of the guide layer 4 (as shown in FIG. 12b). Alternatively, the diffraction grating 5 is uniformly formed first and then the portion corresponding to the phase-shifting region 21 is etched (according to this selective etching process, the shape of the diffraction grating 5 is not blunted substantially). In either cases, the diffraction grating 5 can be formed through a simple process.

When a forward voltage is applied across both the opposing electrodes 9 and 10, due to the existence of the current restriction regions 8, a central stripe-shaped current injection or carrier implantation region is formed in the active layer 3 to cause the single longitudinal mode oscillation selected by the diffraction grating 5 of the guide layer 4 of the active layer 3.

According to this arrangement, the diffraction grating 5 having the width w1 and the uniform pitch is formed over the full length of the waveguide and the effective thickness of the guide layer 4 is changed at the substantially central portion of the diffraction grating 5, that is, its phase-shifting region 21, so that, as shown in FIG. 13A, the transverse mode distribution in the y direction is changed (a solid line represents the mode distribution of the diffraction grating region 22 and a dashed line represents the mode distribution of the phase-shifting region 21), whereby the resultant effective refractive index difference $\Delta N$ causes the $\lambda/4$ phase shift.

Further, since the relationship of the step between the phase-shifting region 21 and the flat portions 23a formed at both sides of the phase-shifting region 21 is the same as that established between the other diffraction grating region 22 and the flat portions 23b formed at both sides of the diffraction grating region 22, the refractive index waveguide property is not substantially changed in the phase-shifting region 21. Therefore, as shown in FIG. 13B, the mode distribution in the x direction is not changed substantially so that the waveguide characteristic of the transverse mode (x direction) can be stabilized.

Further, since the difference h in the thickness of the guide layer 4 between the phase-shifting region 21 and other diffraction grating region 22 is freely selected by the simple control operation in the manufacturing process, the refractive index difference $\Delta N$ can be freely selected. Thus, the length l of the phase-shifting region 21 can be optimized. Furthermore, the diffraction grating 5 can be manufactured with ease. In addition, since the diffraction grating 5 is also formed in the phase-shifting region 21, the coupling, i.e., the reflection effect with respect to the laser of a predetermined wavelength, can be avoided from being lowered.

FIG. 14 shows another embodiment of the diffraction grating 5 according to the present invention. While in the embodiment shown in FIG. 10 the refractive index difference for the $\lambda/4$ phase shift is formed only by one step, according to this embodiment, as shown in FIG. 14, the effective thickness of the guide layer 4 in the phase-shifting region 21 is changed at a plurality of steps, for example, two steps in this embodiment. As a result, the refractive index difference $\Delta N$ is gradually formed by two (or more) steps, thus making it possible to reduce the unwanted reflection of the laser at the boundary between the phase-shifting region 21 and other diffraction grating region 22.

While in the above described embodiments, the present invention is applied to the refractive index guide DFB semiconductor laser, the present invention can also be applied to a gain guide DFB semiconductor laser in a similar fashion.

According to the present invention, as set forth above, the effective thickness of the guide layer in a diffraction grating having a uniform pitch can be made different in the waveguide direction to realize the $\lambda/4$ phase shift. Thus, it becomes possible to provide a DFB semiconductor laser which can operate in the single longitudinal mode oscillation. In this case, since the refractive index difference $\Delta N$ resulting from changing the thickness of the guide layer can be freely selected, the length of the phase-shifting region can be freely selected and then optimized.

Further, since the diffraction grating is also provided in the phase-shifting region, the coupling can be prevented from being deteriorated. Furthermore, since the diffraction grating has a uniform pitch, it can be constructed with ease.

In addition, the present invention can be applied both to the refractive index guide and to the gain guide DFB semiconductor lasers. Particularly, when the present invention is applied to the refractive index guiding DFB semiconductor laser with the rib-waveguide-stripe structure, the waveguide characteristic of the transverse mode (x direction) can be stabilized.

It should be understood that the above description is presented by way of example on the preferred embodiments of the invention and it will be apparent that many modifications and variations could be effected by one with ordinary skill in the art without departing from the spirit and scope of the novel concepts of the invention, so that the scope of the invention should be determined only by the appended claims.

I claim as my invention:

1. In a distributed feed back semiconductor laser of the refractive index guiding type, having a layered structure with two electrodes, the combination comprising:
   (a) a first cladding layer formed on a substrate;
   (b) an active layer formed thereon;
   (c) a guide layer having formed thereon a diffraction grating with a plurality of serially connected regions extending in a longitudinal direction, said regions having a constant width normal to said longitudinal direction which is less than the width of said guide layer; and
   (d) a second cladding layer having a strip-shaped waveguide, with the thickness of said guide layer in a direction normal to said layers being different in one of said regions to change the phase of light propagating through the waveguide, whereby there is a change in the transverse mode distribution in one direction without a substantial change in the transverse mode distribution in the direction perpendicular to said one direction.

2. The distributed feedback semiconductor laser according to claim 1, wherein said diffraction grating is formed to have a uniform pitch.

3. The distributed feedback semiconductor laser according to claim 1, wherein said diffraction grating has a phase-shifting region and diffraction grating regions at both sides of said phase-shifting region in said waveguide direction.

4. The distributed feedback semiconductor laser according to claim 3, wherein the effective thickness of said guide layer with said phase-shifting region is selected to be smaller than that of said guide layer with said diffraction grating regions.

5. The distributed feedback semiconductor laser according to claim 3, wherein said phase-shifting region is formed of a plurality of stepped portions, each being formed on said guide layer.

6. The distributed feedback semiconductor laser according to claim 5, wherein the number of said stepped portions is two.

* * * * *